United States Patent [19]

Mizohata et al.

[11] Patent Number: 4,709,161
[45] Date of Patent: Nov. 24, 1987

[54] TRANSISTOR DRIVE CIRCUIT

[75] Inventors: Fumio Mizohata; Shigetada Goto, both of Hyogo, Japan

[73] Assignee: Mitsubishi Denki Kabushiki Kaisha, Tokyo, Japan

[21] Appl. No.: 845,257

[22] Filed: Mar. 28, 1986

[30] Foreign Application Priority Data

Mar. 29, 1985 [JP] Japan .................................. 60-66036
Mar. 29, 1985 [JP] Japan .................................. 60-66037

[51] Int. Cl.⁴ .................... H03K 3/26; H03K 3/33; G05F 1/40
[52] U.S. Cl. .................................. 307/270; 307/300; 307/315; 323/289
[58] Field of Search ............... 307/270, 300, 254, 315; 323/289, 290

[56] References Cited

U.S. PATENT DOCUMENTS

| 3,852,620 | 12/1974 | Milberger et al. | 307/300 |
| 4,318,011 | 3/1982 | Zeis | 307/300 |
| 4,551,635 | 11/1985 | Kurok | 307/300 |
| 4,605,865 | 8/1986 | Yuzurihara | 307/300 |

OTHER PUBLICATIONS

AC/DC Power Supply Module–Beurtey, International Telecommunications Energy Conference, Nov. 4–7, 1984.

Primary Examiner—Stanley D. Miller
Assistant Examiner—B. P. Davis
Attorney, Agent, or Firm—Bernard, Rothwell & Brown

[57] ABSTRACT

A circuit arrangement for retaining a main transistor in a conductive state while receiving an external turn-on control signal and bringing the main transistor to a complete cut-off state in response to an external turn-off control signal includes a circuit provided on the primary side of a transformer for supplying a turn-on signal or turn-off signal to the main transistor in response to the turn-on or turn-off control signal and a constant current circuit for maintaining the transformer primary current constant so that the currents derived from the turn-on and turn-off signals are kept constant.

7 Claims, 56 Drawing Figures

OSC OUTPUT

STOP OUTPUT

Q1 COLLECTOR CURRENT

COMP INPUT VOLTAGE

Vref

T1 SECONDARY VOLTAGE

T2 VOLTAGE

D2 CURRENT

D3 CURRENT

C3 CURRENT

CURRENT REACTOR

C3 VOLTAGE

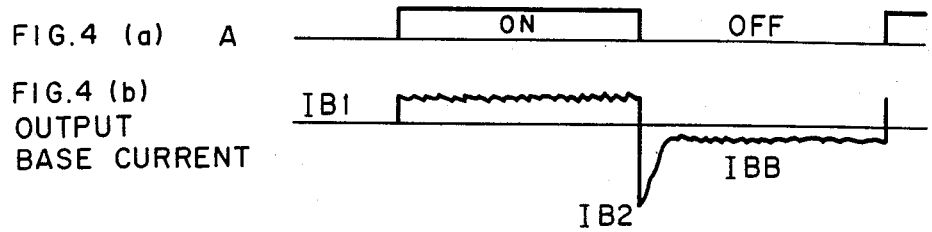
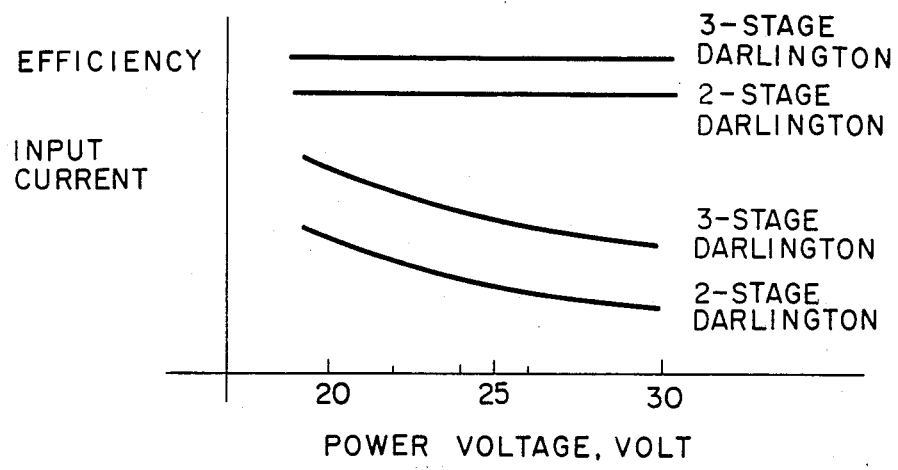
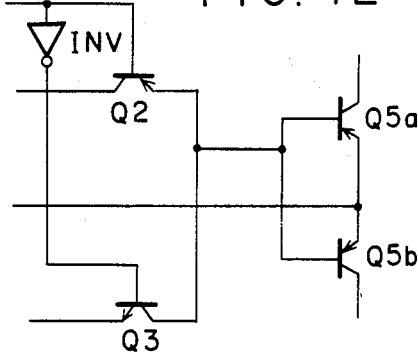

FIG. 8 (b)
STOP OUTPUT 
FIG. 8 (c)
Q1 COLLECTOR CURRENT 
FIG. 8 (d)
COMP INPUT VOLTAGE 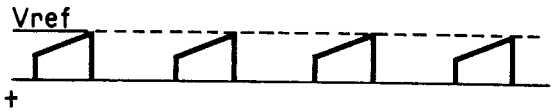
FIG. 8 (e)
T1 SECONDARY VOLTAGE 
FIG. 8 (f)
DFR CURRENT 
FIG. 8 (g)
DFF CURRENT 
FIG. 8 (h)
POSITIVE
OUTPUT BASE
CURRENT
(REACTOR n1 CURRENT) 

OSC OUTPUT

STOP OUTPUT

Q1 COLLECTOR CURRENT

COMP INPUT VOLTAGE

T1 SECONDARY VOLTAGE

DRR CURRENT

DRF CURRENT

NEGATIVE OUTPUT
BASE CURRENT
(REACTOR n2 CURRENT)

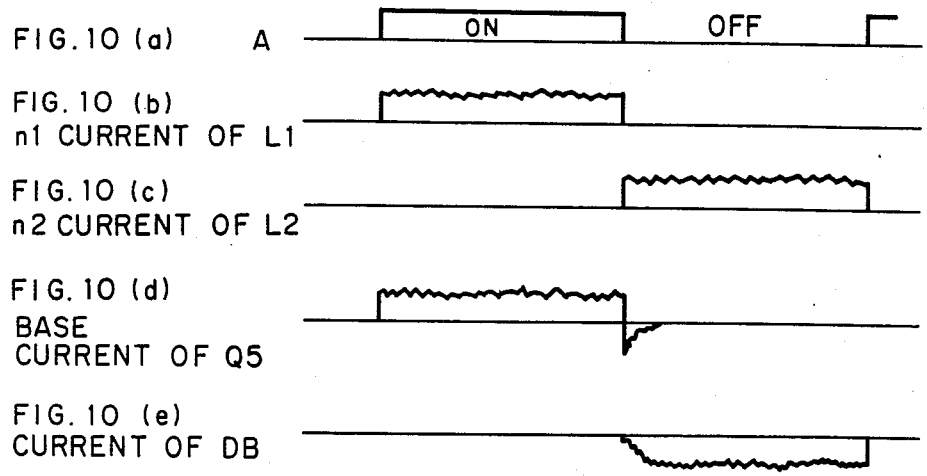
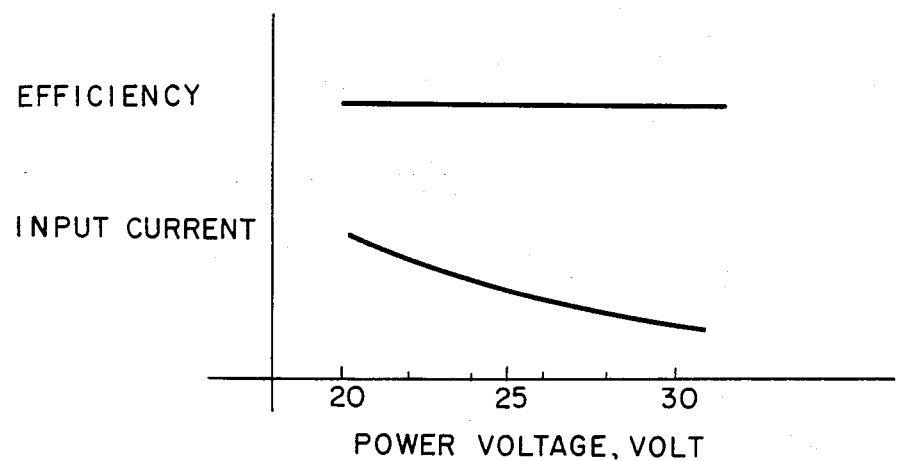
FIG. 11

FIG. 13
(PRIOR ART)
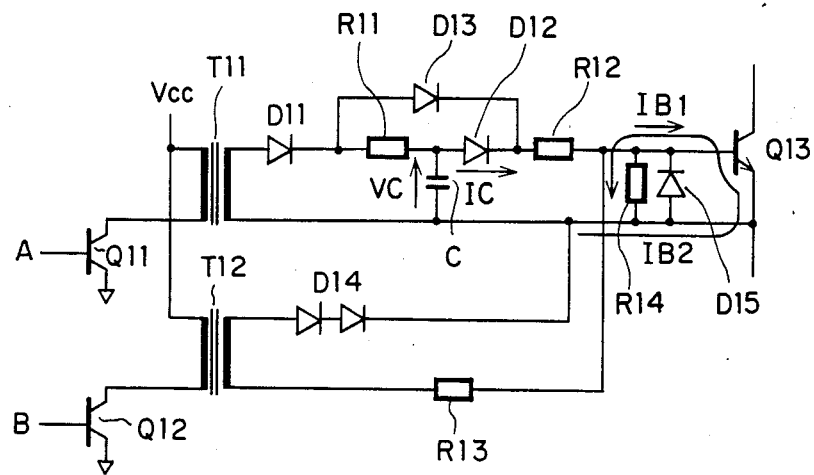
FIG. 14 (PRIOR ART)
FIG. 14(a)
ON-OFF
COMMAND SIGNAL
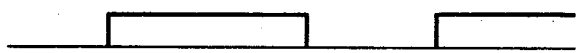
FIG. 14(b)   A
FIG. 14(c)   B
FIG. 14(d)   VC
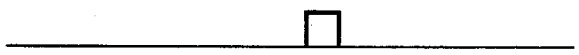
FIG. 14(e)   IB1
             IB2
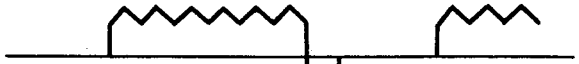

TRANSISTOR DRIVE CIRCUIT

BACKGROUND OF THE INVENTION

1. Field of the Invention

The present invention relates to a circuit arrangement for driving a power transistor in high efficiency.

2. Description of the Prior Art

FIG. 13 shows a conventional transistor drive circuit disclosed in Japanese Laid-open Patent Publication No. 57-151278. The circuit arrangement shown includes a turn-on pulse transformer T11 and a turn-off pulse transformer T12. A transformer driving transistor Q11 has its collector connected to one end of a primary winding of the turn-on transformer T11, while the other end thereof is connected to a d.c. power source Vcc for supplying power to the pulse transformers. A secondary winding of the transformer T11 has one end connected to the anode of a diode D11 which has its cathode line branching into two paths. One of the paths includes a filter circuit made up of a charging current limiting resistor R11 and a capacitor C, and a diode D12, and the other path includes a diode D13 which is connected to bypass the former path. The node of both paths opposite to the diode D11 is connected through a base current limiting resistor R12 to the base of a main transistor Q13 which constitutes part of a main circuit. The other end of the secondary winding of the turn-on pulse transformer T11 is connected directly to the emitter of the main transistor Q13.

In the circuit section for processing the turn-off signal, the turn-off pulse transformer T12 driven by a transistor Q12 is connected at its one end of the secondary winding to the emitter of the main transistor Q13 through a branch current suppressing diode D14 (which also serves to rectify the turn-off signal), and connected at another end of the secondary winding to the base of the main transistor Q13 through a reverse bias current limiting resistor R13. Further connected between the base and emitter of the main transistor Q13 is a parallel connection of a diode D15 and a bypass resistor R14.

The operation of the above circuit arrangement is as follows. Supposing the issuance of a turn-on command signal shown in FIG. 14(a) applied to a pulse generator (not shown) so that it generates a train of high-frequency pulse signals A applied to the base of the transistor Q11, and the transistor Q11 becomes conductive in response to a rise of the signal A to energize the turn-on pulse transformer T11. The transformer T11 produces a turn-on signal on its secondary winding, which is rectified by the diode D11 and supplied as a sharp-rising base current IB1 shown in FIG. 14(e) to the base of the main transistor Q13 via the diode D13 and current limiting resistor R12, causing the main transistor Q13 to become conductive. During the above operation, the capacitor C is charged through the charging current limiting resistor R11.

Subsequently, when the pulse signal A goes low, causing the transistor Q11 to cut off, the diodes D11 and D13 also become nonconductive, but the charge in the capacitor C retains the diode D12 conductive and the discharge current from the capacitor C flows through the diode D12 and base current limiting resistor R12 to the base of the main transistor Q13. Consequently, the main transistor Q13 stays conductive. As a result of discharging, the voltage across the capacitor C falls as shown in FIG. 14(d). By the iteration of these operations, the capacitor voltage VC and the base current IB1 have ripple components as shown in FIG. 14(d) and (e), and the main transistor Q13 is held in the on-state by the base current IB1.

The cut-off operation for the main transistor Q13 is implemented by the removal of the turn-on command so as to cease the pulse signals A and, at the same time, by supplying a turn-off pulse signal B shown in FIG. 14(c) to the base of the transistor Q12 driving the turn-off transformer T12. The turn-off signal produced on the secondary winding of the pulse transformer T12 in response to the signal B is rectified by the diode D14, which also serve for branch current suppression, and applied to the emitter of the main transistor Q13, causing a sharp reverse bias current IB2 shown in FIG. 14(e) to flow from the emitter to the base, and the main transistor Q13 is cut off. In this case, the reverse bias current limiting resistor R13 is preferably chosen to have resistance sufficiently smaller than the resistance of the base current limiting resistor R12, so that the main transistor Q13 operates in a minimal cut-off time. Remaining charge in the capacitor C is discharged as a discharge current IC, and the voltage VC across the capacitor C is clipped as shown in FIG. 14(d).

The conventional transistor drive circuit as set forth above necessitates a base current limiting resistor, as can be seen from the above description, and a variation in $V_{BE}$ of the main transistor due to its collector current and a variation in the supply voltage can cause the variation in the base current. In addition, the resistance current limitation results in an increased power loss and therefore heat generation. The reverse bias circuit enters the nonconductive state by being reversely biased solely at the moment of turn-off, and the circuit is apt to malfunction in the presence of noises and needs two pulse transformers having the withstand voltage against the main circuit.

SUMMARY OF THE INVENTION

It is an object of the present invention to provide a transistor drive circuit which operates efficiently and therefore has a decreased heat generation.

According to one aspect of this invention, the transistor drive circuit comprises a transformer having primary and secondary windings, a first transistor for controlling the current flowing in the primary winding of the transformer, a means for detecting the value of current flowing in the primary winding of the transformer, a comparison means which produces an output when the current value detected by the current detection means exceeds a preset value, a cut-off means which retains the first transistor in the cut-off state while receiving the output of the comparison means, a saturable transformer having primary and secondary windings connected to the secondary winding of the above-mentioned transformer, a reverse bias circuit connected to the secondary winding of the saturable transformer, a means for smoothing the current flowing in the primary winding of the saturable transformer, a second transistor operative to supply the smoothed current produced by the smoothing means as a turn-on signal to the base of a main transistor while receiving a turn-on control signal from outside, a third transistor operative to supply a current from the reverse bias circuit as a turn-off signal to the base of the main transistor while receiving a turn-off control signal from outside, and a fourth transistor operative to conduct the output of the smoothing means to a common line in response to the turn-off control signal.

In the transistor drive circuit of this invention, a smoothing reactor is designed so that the base current of the main transistor includes a ripple component created by the high-frequency switching operation to which the main transistor cannot respond, and the current of the secondary winding of the transformer is made constant on an on-off control basis through the detection of the peak current on the primary winding. At turning off the main transistor, the output terminal of the reactor is shorted to bypass the current, resulting in a sharp rise of the current in the next turn-on cycle. The saturable transformer connected to the secondary winding of a transformer operates to charge the capacitor until it is saturated, and the stored charges are used as a reverse bias power source in the turn-off operation, whereby efficient and responsive transistor drive can be accomplished.

According to another aspect of this invention, the transformer has a pair of secondary windings connected to respective rectifiers and smoothing reactors sharing a core, and the reactor currents are switched at turn-on and turn-off operations so as to speed up the rise of the main circuit current.

BRIEF DESCRIPTION OF THE DRAWINGS

FIG. 4a and 4b are a waveform of the turn-on/turn-off control signal and the driving base current;

FIG. 5 is a graph showing the values of the input current and efficiency against the supply voltage variation;

FIG. 10a-e are a waveform diagram showing the signals at various portions of the circuit arrangement shown in FIG. 7;

FIG. 11 is a graph showing the values of the input current and efficiency against the supply voltage variation;

FIG. 12 is a schematic diagram showing in part a modified circuit arrangement;

FIG. 13 is a schematic diagram showing a conventional transistor drive circuit; and FIG. 14a-e are a waveform diagram showing the signals at various portions of the circuit arrangement shown in FIG. 13.

DESCRIPTION OF THE PREFERRED EMBODIMENTS

An embodiment of this invention will be described with reference to the drawings. The circuit arrangement shown in FIG. 1 includes an oscillator 16, a cut-off circuit 14, a switching transistor Q1, a current sensing resistor R2, a resistor R1 and capacitor C1 constituting a filter circuit for the signal produced by the current sensing resistor R2, a current setting voltage source Vr, a voltage comparator 12 comparing the current value detected by the current sensing resistor R2 with the current setting voltage across the voltage source Vr and providing a signal to the cut-off circuit 14 if the actual current value exceeds the setting so as to block the signal from the oscillator 16, a transformer T1, a saturable transformer T2, a rectifier D1 and capacitor C2 for providing the power voltage for the control circuit, a rectifier D4 and capacitor C3 provided on the secondary winding of the saturable transformer T2 for producing the reverse bias power voltage, a zener diode ZD1 for absorbing voltage surges, a rectifying diode D2, a fly-wheel diode D3, a smoothing reactor L1, a turn-on base drive transistor Q2, a turn-off base reverse bias transistor Q3, a reactor output shunting transistor Q4, a reverse bias current limiting resistor R3, a logical inverter circuit INV, and a photocoupling device PC1 for isolating the external turn-on/turn-off signal electrically and transmitting the signal to the base drive circuit.

Figure 2:
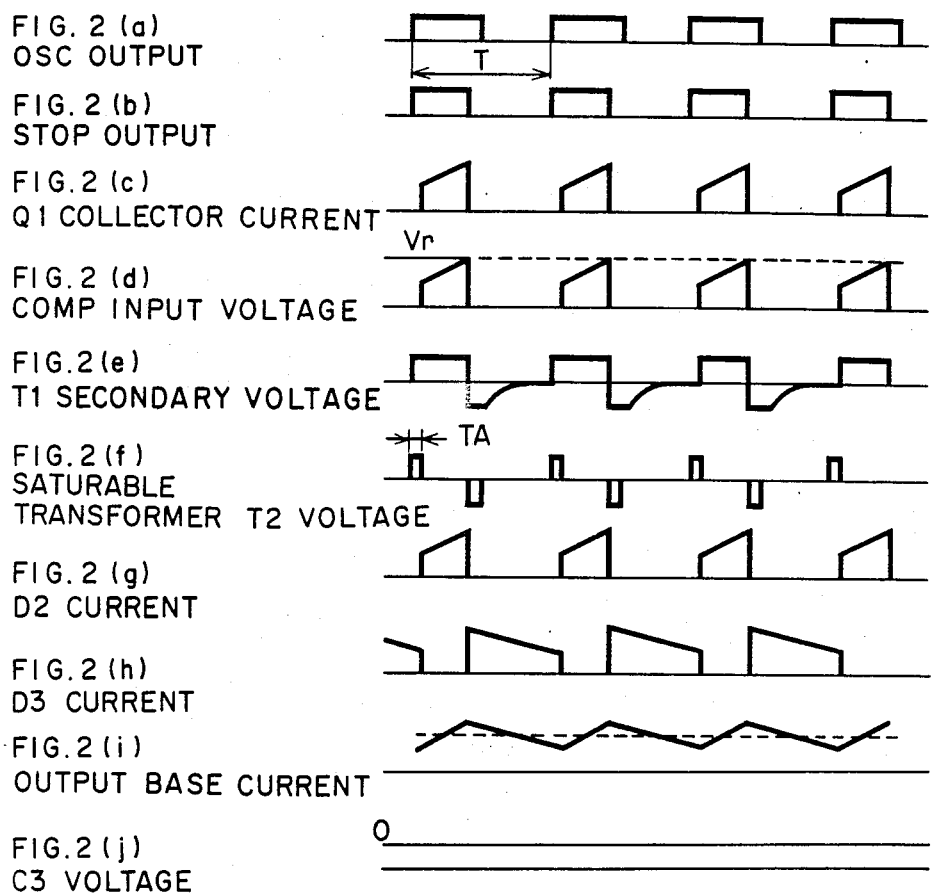
FIGS. 2A-J and 3A-K are waveform diagrams showing the signals at various portions of the circuit arrangement in the on-state and in the off-state of the main transistor, respectively.
Figure 3:
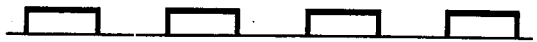
Figure 3:
Figure 3:
Figure 3:
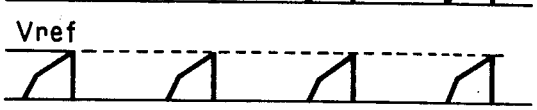
Figure 3:
Figure 3:
Figure 3:
Figure 3:
Figure 3:
Figure 3:
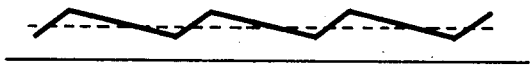
Figure 3:
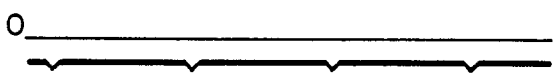

Next, the operation of the above circuit arrangement will be described. The self-running oscillator 16 operates to produce an alternating signal of which the waveform is shown in FIG. 2(a). The signal is conducted through the cut-off circuit 14 and supplied as a control signal to the switching transistor Q1 connected in series to the primary winding of the transformer T1, and power is fed to the secondary winding to the transformer T1. When the turn-on signal A is entered through the photocoupling device PC1, the transistor Q2 becomes conductive, the transistors Q3 and Q4 are cut off, and the operation of supplying a positive base current to the main transistor Q5 takes place.

The operation will be described in detail with reference to FIG. 2(a)-(j) showing the signal waveforms at various portions of the circuit. The current sensing resistor R2 detects the collector current of the switching transistor Q1 as shown in FIG. 2(c) and produces a voltage signal representing the current value. When the signal voltage becomes equal to the current setting voltage Vr shown in FIG. 2(d) which corresponds to the required base current value in the secondary winding circuit, the voltage comparator 12 responds to it and issues a halt signal so that the cut-off circuit 14 suspends the base current to the switching transistor Q1 within the on-cycle as shown in FIG. 2(b). The filter circuit made up of the resistor R1 and capacitor C1 is to prevent the voltage comparator 12 from malfunctioning due to current surges created by the snubber circuit (not shown) for the switching transistor Q1 and the control power circuit.

The voltage shown in FIG. 2(e) is produced across the secondary winding of the transformer T1 by being lowered from the primary voltage in accordance with the turn ratio of T1, and it is first applied to the saturable transformer T2 (at this moment a positive base current is flowing through the fly-wheel diode D3 and the smoothing reactor L1) so that the reverse bias power circuit made up of the diode D4 and capacitor C3 on the secondary winding is charged. FIG. 2(j) shows the state after charging has completed and no current flows in the secondary winding of the saturable transformer T2. After the saturable transformer T2 has been put into saturation, a positive base current flows through the rectifier D2 and smoothing reactor L1 to the main transistor Q5.

For the operating condition of Vcc=24 volts, transformer T1 turn ratio 2:1 rectifying diode D2, fly-wheel diode D3 and turn-on base drive transistor Q2 forward voltage drop VF=1 volt, and main transistor Q5 base-emitter voltage $V_{BE}=2$ volts, as an example, the voltage necessary in one cycle is, $$V_o = VF + V_{BE}$$
$$= 3 \text{ volts}$$

Secondary voltage = $V_{cc}$ × turn ratio (¼)
$$= 12 \text{ volts}$$

$$V_o = \frac{T_{ON}}{T_{ON} + T_{OFF}} \times \text{secondary voltage}$$

3 volts/12 volts = 0.25

Accordingly, the switching transistor needs to be conductive for a 25% period in a cycle.

Assuming the saturable transformer T2 to have a nonsaturation period of TA=1 μs and the oscillation frequency to be 100 kHz (period of 10 μs), the duty cycle is calculated as 10 μs×0.25+1 μs=3.5 μs, and it becomes 0.35.

These operations are repeated, and a constant base current is supplied to the main transistor Q5. As will be appreciated from the foregoing description, the base current is maintained constant against the variation in the power voltage Vcc and a load variation (variation in the base-emitter voltage $V_{BE}$ caused by the variation of the collector current of the main transistor) by the control of the current ratio in response to the detection of the secondary current from the primary side. The foregoing circuit arrangement does not include a current sensing resistor in the secondary circuit, the current value detected on the primary side is decreased in proportion to the turn ratio, and the use of the voltage comparator allows the detection of a small current value, whereby the power loss is extremely small as compared with the conventional circuit shown in FIG. 13.

The reason for choosing the smoothing reactor so as to allow some ripple component is to stabilize the detection of the current peak, otherwise the current waveform in the switching transistor Q1 resembles a rectangular waveform making the detection unstable. The ripple component of the base current is chosen so that it does not appear as a variation in the collector current of the main transistor, and the oscillator output frequency is chosen beyond the response of the main transistor.

Next, the operation with the turn-off signal entered through the photocoupling device PC1 will be described with reference to FIG. 3(a)–(k) showing the waveforms of various portions of the circuit. At the moment when the main transistor Q5 has made a transition from the conductive state to the cut-off state, the transistors Q3 and Q4 become conductive and the transistor Q2 cuts off, and the capacitor C3 is discharged through the turn-off current limiting resistor R3, causing current carries in the main transistor Q5 to be pulled out as a reverse bias current. The conductive transistor Q4 bypasses the current from the reactor L1 to the common line, and it conducts a current equal in magnitude to the positive base current preparatory to the next turn-on operation.

Different from the turn-on operation, a reverse bias current needs to be supplied. When the switching transistor Q1 becomes conductive to supply the current necessary for the reverse bias rectifying circuit connected to the secondary winding of the saturable transformer T2, a short current pulse, FIG. 3(i), flows through diode D4 negatively charging capacitor C3. The rectifying diode D2 and fly-wheel diode D3 in the secondary circuit are branched by the current flowing in the secondary winding of the saturable transformer T2 in the nonsaturation state. For the operating condition of the rectifying diode D2, fly-wheel diode D3 and shunting transistor Q4 forward voltage drop VF=1 volt, the voltage necessary in one cycle is merely Vo=VF=1 volt, and with the same remaining conditions as for the turn-on operation, 1 volt/12 volts=0.083, and the switching transistor Q1 needs to be conductive for a 8.3% period in a cycle. Including the saturable transformer, T×0.083+1 μs=1.83 μs, the duty cycle becomes 0.18, which is smaller than the case of the turn-on operation. FIG. 4(a) and (b) show the input and output waveforms in the foregoing turn-on and turn-off operation.

The zener diode ZD1 is used to absorb energy discharged from the smoothing reactor during a delay of current rising caused by the reactive component for the wiring to the main transistor Q5 and the like when the transistor Q4 has made a transition from the conductive state to the cut-off state and the transition of the transistor Q2 from the cut-off state to the conductive state, and this period is generally shorter than 0.5 μs.

FIG. 5 shows in graph the input current and the efficiency versus input power voltage $V_{cc}$ when the circuit performs a switching operation of a two-stage Darlington transistor set and a three-stage Darlington transistor set, respectively. The output current, FIGS. 2(i) and 3(j), stays relatively constant (except for the ripple component) and the variation of efficiency is as small as 2% or less despite the occurrence of power input voltage variation.

Figure 6:
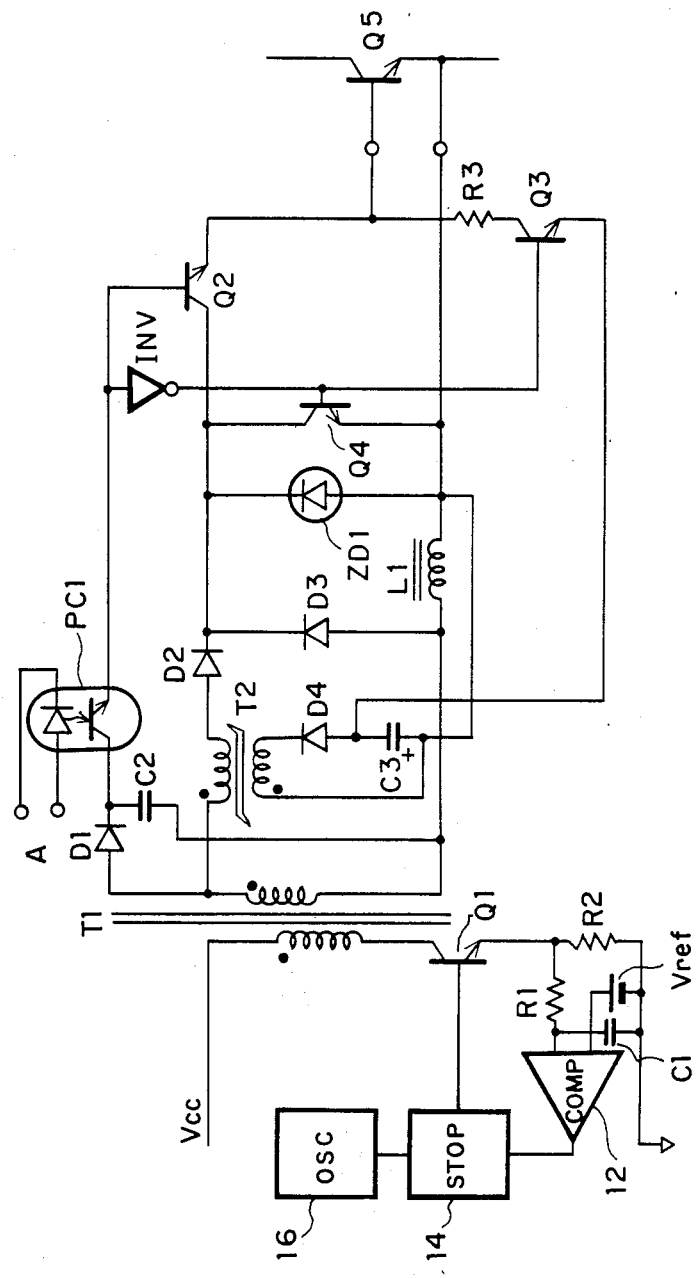
FIG. 6 is a schematic diagram showing another embodiment of the present invention.

Although the foregoing embodiment is the case of including the saturable transformer T2 and smoothing reactor L1 connected in series to the rectifying diode, they may be inserted on the common line as shown in FIG. 6 with expectation of the same effectiveness as described in the above embodiment. In the arrangement of FIG. 6, the diodes D2 and D3 and transistors Q4 and Q2 have a common terminal, allowing these components to be mounted on the same heat sink, and the heat sink can have a smaller cooling area owing to the alternate operation of the transistors Q4 and Q2.

Figure 1:
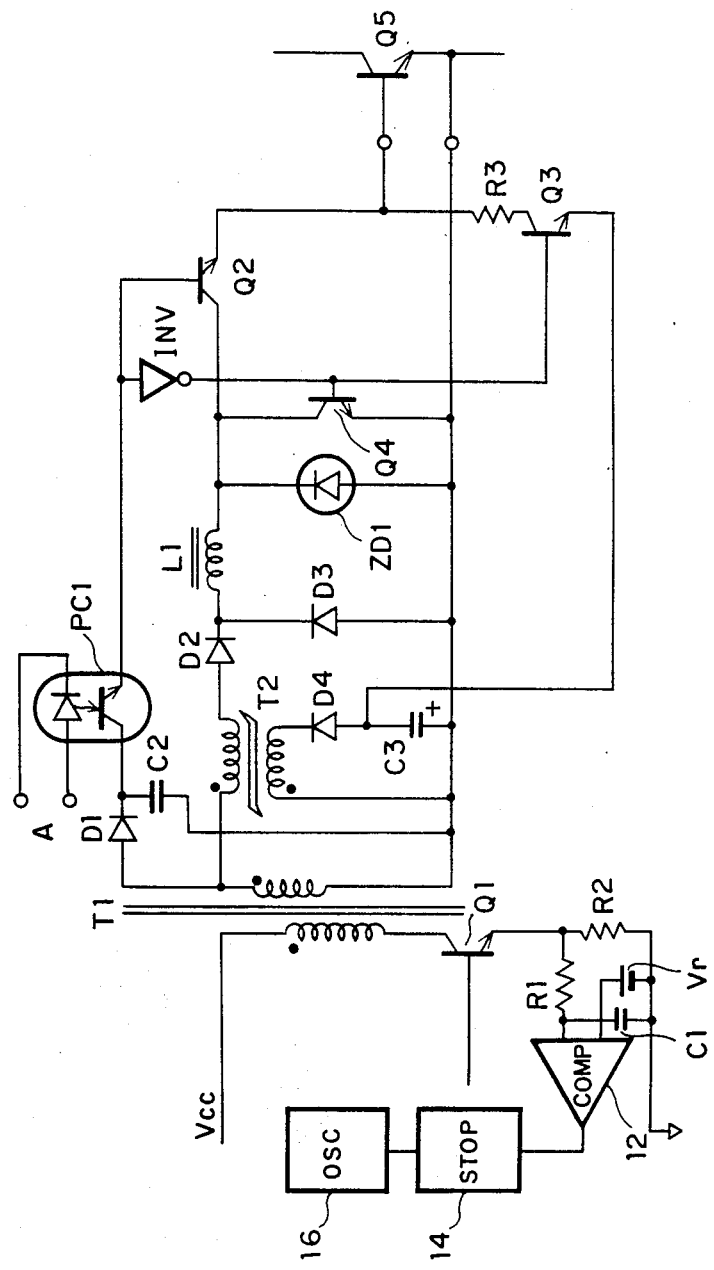
FIG. 1 is a schematic diagram showing the transistor drive circuit embodying the present invention.
Figure 7:
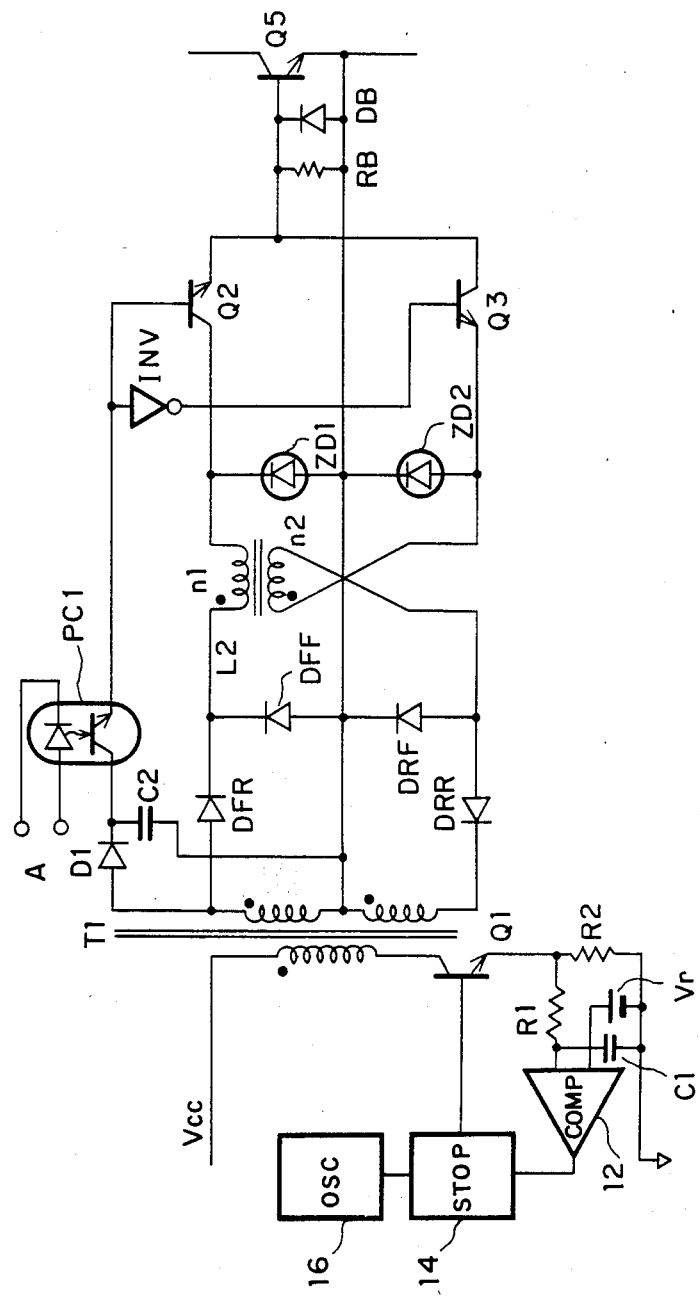
FIG. 7 is a schematic diagram showing still another embodiment of the present invention.
Figure 8:
FIGS. 8A-H and 9A-A are waveform diagrams showing the signals at various portions of the circuit arrangement of FIG. 7 in the on-state and in the off-state of the main transistor, respectively.

FIG. 7 shows the modified embodiment of this invention, in which components identical to those shown in FIG. 1 are referred to by the common symbols. In this circuit arrangement, one end of the secondary winding of the transformer T1 is connected through a diode DFR to one end of winding n1 of a smoothing reactor L2, while another end of the secondary winding is connected through a diode DRR to one end of winding n2 of the smoothing reactor L2. The secondary winding of the transformer T1 has a center tap, which is connected through a diode DFF to the cathode of the DFR and through a diode DRF to the anode of the DRR. The winding n1 of the reactor L2 has another end connected to the collector of the transistor Q2 and further connected through a zener diode ZD1 to the center tap of the secondary winding of the transformer T1, while the winding n2 has another end connected to the emitter of the transistor Q3 and further connected through a zener diode ZD2 to the center tap of the T1. The zener diodes ZD1 and ZD2 are to absorb voltage surges created on the outputs of the windings n1 and n2. Connected between the base and emitter of the main transistor Q5 is a parallel connection of a bias resistor RB and a bias diode DB.

The operation of the transistor drive circuit shown in FIG. 7 will be described with reference to the waveforms of FIG. 8(a)–(h). Initially, when power is turned on, the oscillator 16 provides the alternating signal for the switching transistor Q1, and the alternating current is produced on the secondary winding of the transformer T1. When the turn-on signal shown in FIG. 10(a) is entered through the photocoupling device PC1, causing the transistor Q2 to be conductive and transistor Q3 cut off, a positive base current is supplied to the main transistor Q5.

The current sensing resistor R2 detects the current flowing through the transistor Q1, and when the detected current value has become equal to the current setting voltage Vr representing the necessary base current in the secondary circuit, the voltage comparator 12 operates on the cut-off circuit 14 to suspend the base current to the switching transistor Q1 within the cycle.

The voltage produced on the secondary winding of the transformer T1 by being lowered in accordance with the turn ratio is rectified by the positive output diode DFR and then fed through the positive output winding n1 of the smoothing reactor L2 as a positive base current.

Figure 9:
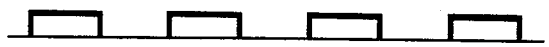
Figure 9:
Figure 9:
Figure 9:
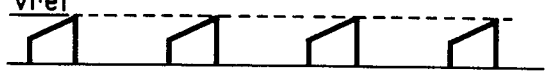
Figure 9:
Figure 9:
Figure 9:
Figure 9:

Next, the operation with the turn-off signal entered through the photocoupling device PC1 will be described with reference to FIG. 9. At the moment when the main transistor Q5 makes a transition from the conductive state to the cut-off state, the transistor Q3 becomes conductive and the transistor Q2 cuts off, causing the current which has been flowing in the positive output winding n1 of the reactor L1 to be transferred to the negative output winding n2 and current carriers in the main transistor Q5 are pulled out and it is cut off. Different from the turn-on operation, for the negative output diode DRR, fly-wheel diode DRF and turn-off base driving transistor Q3 forward voltage drop VF=1 volt and the external reverse bias diode DB forward voltage drop $V_{BE}=1$ volt, the voltage in the cycle is, $$V_o = VF + V_{BE}$$
$$= 2 \text{ volts}$$

For the same remaining conditions as for the turn-on operation, 2 volts/12 volts=0.166

Accordingly, the switching transistor Q1 become conductive for a 16.66% period in a cycle, which results in a smaller input power than the turn-on operation. With the alternating drive signal A supplied through the photocoupling device PC1, the positive output winding n1 and negative output winding n2 of the smoothing reactor L1, the base of the main transistor Q5 and the bias diode DB produce the operating waveforms as shown in FIG. 10(a)–(e).

The zener diode ZD2 is used to absorb energy emitted from the smoothing reactor during a delay in current rising caused by the wiring to the main transistor Q5 and the like when the transistor Q3 has become cut off or the transistor Q2 has become conductive, while the zener diode ZD1 is used for the reverse operation.

The above transitional time length is normally shorter than 0.5 μs.

FIG. 11 is a graph showing the input current and efficiency versus the input power voltage $V_{cc}$ for alternating operation of a two-stage Darlington transistor set as the main transistor Q5. The sum of the output, FIG. 8(h), of windings n1 and n2 of reactor L2 is maintained relatively constant (except for a ripple component) and the variation in the efficiency is within 2% despite any power input voltage variation.

The reason for choosing the smoothing reactor L2 to allow some ripple component is to stabilize the current peak detection, otherwise too large capacity of the reactor would make the current waveform of the switching transistor Q1 resemble a rectangular waveform, resulting in the unstable detection. On this account, a smaller smoothing reactor L1 is chosen provided that the ripple component of the base current does not result in the variation in the collector current of main transistor. The output frequency of the oscillator 16 is chosen so as to produce a high ripple frequency beyond the response of the main transistor Q5.

Although in the above embodiment the reverse bias current flows in the bias diode DB, if it is intended to drive a complementary transistor pair Q5a and Q5b as shown in FIG. 12, a base drive circuit can be shared by these transistors advantageously.

As described above, the inventive transistor drive circuit is configured in a single-transistor forward switching mode base drive circuit, and a constant base current is achieved by the control on the primary circuit of the transformer, whereby high-performance transistor drive in high efficiency and low heat generation can be accomplished.

What is claimed is:

1. A circuit arrangement for driving a main transistor comprising:
   a first transformer having primary and secondary windings;
   a first transistor connected in series with the primary winding of said first transformer for controlling a current flowing through the primary winding of said transformer;
   means for detecting the value of the current flowing through the primary winding of said first transformer;
   comparison means responsive to the detected current value for producing an output when the current value detected by said current detecting means exceeds a predetermined value;
   cut-off means connected to the comparison means for rendering said first transistor in a cut-off state during the output of said comparison means;
   a saturable transformer having primary and secondary windings with a first side of the primary winding of the saturable transformer connected to the secondary winding of said first transformer;
   a reverse bias circuit connected to the secondary winding of said saturable transformer;
   means for smoothing current flowing through the primary winding of said saturable transformer;
   a second transistor operated by a turn-on control signal and connected between a second side of the primary winding of said saturable transformer and a base of said main transistor for supplying a turn-on current to the base of said main transistor during the turn-on control signal;

a third transistor operated by a turn-off control signal and connected between said reverse bias circuit and the base of said main transistor for supplying a turn-off current form said reverse bias circuit to the base of said main transistor during the turn-off control signal; and a fourth transistor operated by the turn-off control signal and connected between the second side of the primary winding of the saturable transformer and a common line for shunting the output current of the primary winding of said saturable transformer to the common line in response to said turn-off control signal.

2. A transistor drive circuit according to claim 1, wherein said smoothing means comprises a reactor.

3. A transistor drive circuit according to claim 2 further comprising a zener diode connected in parallel with the fourth transistor for absorbing surges.

4. A transistor drive circuit according to claim 1, wherein said reverse bias circuit comprises a serial connection of a diode and a capacitor connected between the secondary winding of said saturable transformer and said common line, said turn-off current being produced at the node of said diode and said capacitor.

5. A circuit arrangement for driving a main transistor comprising:

a transformer having a primary winding and a secondary winding with a center tap provided thereon;

a first transistor connected in series with the primary winding of said transformer for controlling a current flowing through the primary winding of said transformer;

means for detecting the value of current flowing through the primary winding of said transformer;

comparison means responsive to the detected current value for producing an output when the current value detected by said current detection means exceeds a predetermined value;

cut-off means connected to the comparison means for rendering said first transistor in a cut-off state during the output of said comparison means;

first and second rectifying means connected to said transformer so as to extract a positive output component at one end of the secondary winding of said transformer and extract a negative output component at another end of the secondary winding of said transformer, respectively;

a reactor having a first winding connected to said first rectifying means and a second winding connected to said second rectifying means;

a second transistor operated by a turn-on control signal and connected between the first winding of said reactor and a base of said main transistor for supplying a turn-on current from the first winding of said reactor to the base of said main transistor during the turn-on control signal; and a third transistor operated by a turn-off control signal and connected between the second winding of said reactor and the base of said main transistor for supplying a turn-off current from the second winding of said reactor to the base of said main transistor during the turn-off control signal.

6. A transistor drive circuit according to claim 5 further comprising zener diodes for absorbing surges connected between one end of the first winding of said reactor and a common line connected to the center tap of said transformer, and between one end of the second winding of said reactor and said common line, respectively.

7. A transistor drive circuit according to claim 6, wherein said main transistor comprises a Darlington transistor pair.

* * * * *